United States Patent
Gui

(10) Patent No.: US 7,333,177 B2
(45) Date of Patent: Feb. 19, 2008

(54) LITHOGRAPHIC APPARATUS AND DEVICE MANUFACTURING METHOD

(75) Inventor: Cheng-Qun Gui, Best (NL)

(73) Assignee: ASML Netherlands B.V., Veldhoven (NL)

( * ) Notice: Subject to any disclaimer, the term of this patent is extended or adjusted under 35 U.S.C. 154(b) by 201 days.

(21) Appl. No.: 10/999,159

(22) Filed: Nov. 30, 2004

(65) Prior Publication Data

US 2006/0114446 A1    Jun. 1, 2006

(51) Int. Cl.
    *G03B 27/54*    (2006.01)
    *G03B 27/42*    (2006.01)
    *G02B 26/00*    (2006.01)

(52) U.S. Cl. ............................ 355/67; 355/53; 359/290

(58) Field of Classification Search ............... 355/67, 355/53; 359/291, 290
    See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,379,867 B1* | 4/2002 | Mei et al. | 430/296 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2004/0041104 A1 | 3/2004 | Liebregts et al. | |
| 2004/0075882 A1* | 4/2004 | Meisburger | 359/290 |
| 2004/0130561 A1 | 7/2004 | Jain | |
| 2005/0007572 A1 | 1/2005 | George et al. | |

FOREIGN PATENT DOCUMENTS

| | | |
|---|---|---|
| WO | WO 98/33096 | 7/1998 |
| WO | WO 98/38597 | 9/1998 |

\* cited by examiner

*Primary Examiner*—Peter B. Kim
(74) *Attorney, Agent, or Firm*—Sterne, Kessler, Goldstein & Fox P.L.L.C.

(57) ABSTRACT

A lithographic method and apparatus used to pattern an object. An illumination system supplies a beam of radiation. An array of individually controllable elements patterns the beam. The patterned beam is projected by a projection system on to a substrate supported on a substrate table. Individual elements of the array are periodically addressed to load an image frame on to the array appropriate to the pattern to be imparted to the beam at any given instant in time taking into account the image to be projected onto the substrate. In any given frame loading operation, only those individual controllable elements that must change state are addressed to reduce the amount of data required to be transferred during the frame loading operation.

63 Claims, 10 Drawing Sheets

LITHOGRAPHIC APPARATUS AND DEVICE MANUFACTURING METHOD

BACKGROUND

1. Field of the Invention

Figure 1:
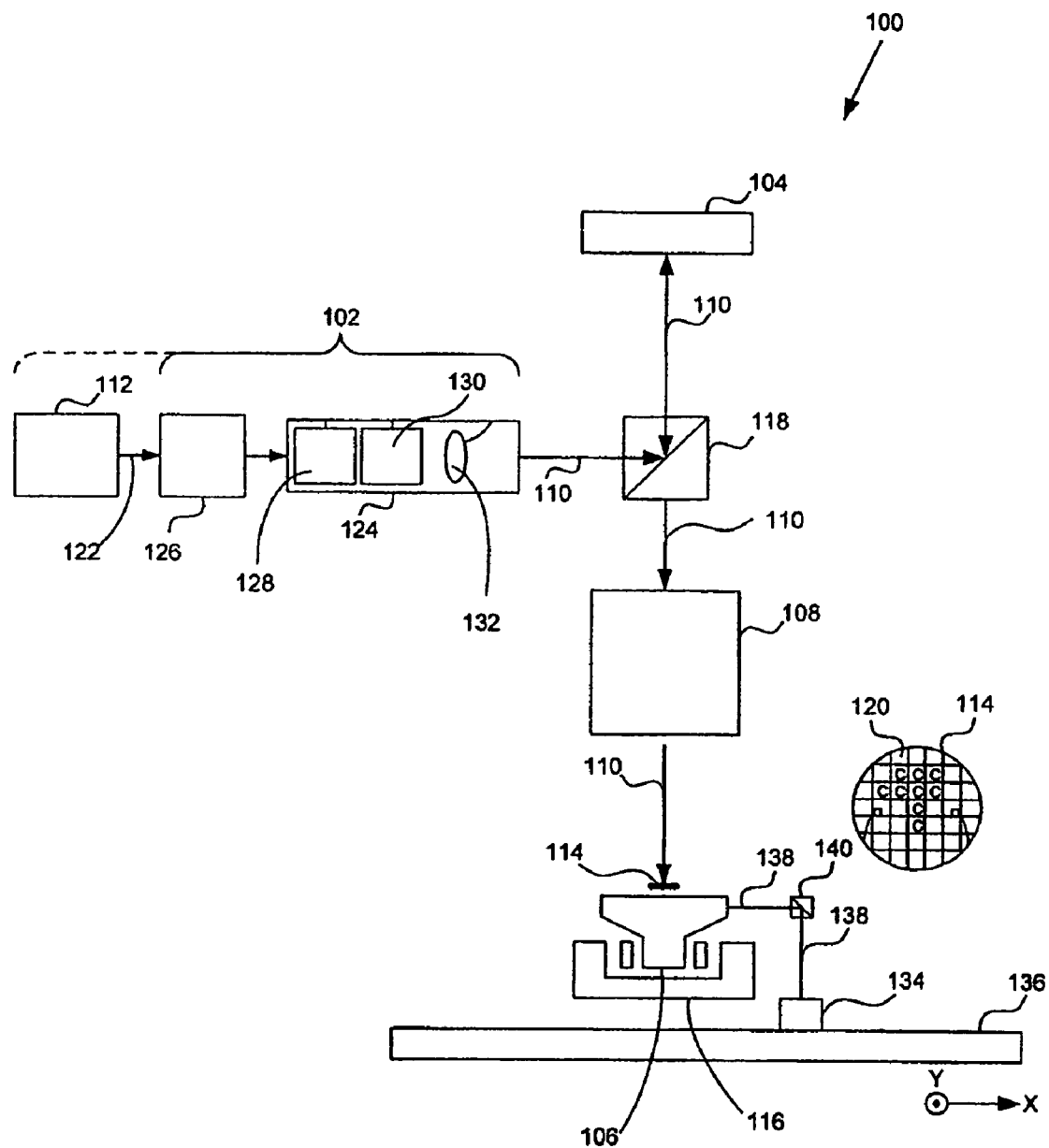

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, that is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in that each target portion is irradiated by exposing an entire pattern onto the target portion in one go, and scanners, in that each target portion is irradiated by scanning the pattern through the beam in a given direction (the "scanning" direction), while synchronously scanning the substrate parallel or anti-parallel to this direction.

Other possible modes of operation of lithographic apparatus are discussed below, including a pulse mode and a continuous scan mode applicable to apparatus including patterning means comprising an array of individually controllable elements, as mentioned above. With such apparatus, it is desirable to periodically update the array (often referred to as a spatial light modulator—SLM) to ensure that the instantaneous pattern generated is appropriate to the image to be transferred to the substrate. For instance, when operated in pulse mode (described below) the SLM can be updated as required between pulses of the radiation system. In a continuous scan mode rapid updating of the SLM can occur as the beam scans across the substrate.

The time required to update the SLM, i.e., load a new image frame on to the SLM, is a determining factor on apparatus throughput. For example, in the case of flat panel display (FPD) production, the apparatus can typically operate in a pulse scan mode with laser pulsing 50 KHz with 10/20 nsec pulse duration. Such a high frequency provides acceptable apparatus throughput, particularly because of the large substrate areas that are conventionally scanned to product FPDs. In order to load an SLM frame between pulses, in view of the large number of individually controllable elements, data transfer rates of the order of 10-100 Gpixels/sec or more are required. This can require the use of complex and expensive data handling and image driver systems. In addition, with such high data transfer rates, the chance of data errors occurring can be relatively high.

Therefore, what is needed is a system and method that reduces an amount of data required for maskless lithography.

SUMMARY

According to an aspect of the present invention, there is provided a device manufacturing method comprising the following steps. Patterning a beam of radiation with an array of individually controllable elements. Projecting the patterned beam onto a target portion of a substrate. Periodically addressing individual elements of the array of individually controllable elements in an image frame loading operation to set a state of each individually controllable element appropriate to the pattern to be projected. Only those individually controllable elements that must change state are addressed each time a frame is loaded.

Only a fraction of the total number of individually controllable elements of the array can actually be required to change state between any two successive image frames. For example, one element can be required to remain in an "on" state for a plurality of successive image frames whereas another element can be required to remain in an "off" state for a plurality of successive image frames. By addressing only those elements that must change state each time a new image frame is loaded on to the array in accordance with the present invention, the data requirement can be significantly reduced. This enables either the time required to load a new frame to be significantly reduced for a given data transfer rate, or a reduction in the required data transfer rate in order to update an image frame in a required time.

In one example, scanning the target portion of the substrate to project an image on to the target portion is performed. The scanning operation is performed by moving the substrate and/or patterned beam of radiation to produce relative movement between the two in at least a first scan direction. If, for instance, the beam comprises pulses of radiation, each new image frame can be loaded between radiation pulses. If, alternately, the beam comprises radiation that is continuous during the scanning operation, new image frames can be loaded as the patterned beam scans across the substrate.

In one example, it is possible to minimize the data transfer requirement by selecting a target portion scan direction that minimizes the number of elements of the array that must change state as any single image frame is loaded. For most images to be scanned it is likely that some possible scan directions will require a greater number of changes of state of elements of the array of individually controllable elements than other scan directions. Given that, in example, only elements that must change state are addressed each time an image frame is loaded. This is done by selecting a scan direction that minimizes the number of required changes the data transfer requirement is similarly minimized.

In one example, the scan direction can, for example, be selected relative to the image to be projected during the scan operation taking into account image feature boundaries across that individually controllable elements of the array change state as the target portion is scanned. For example, the scan direction can be selected so that the total length of the image feature boundaries resolved parallel to the scan direction, and that can be exposed to the patterned beam of radiation at any instant in time, is equal to or greater than the total image boundary length resolved orthogonally to the scan direction, and that can be exposed to the patterned beam of radiation at any instant in time. Image feature boundaries can, for instance, be hard boundaries between exposed and unexposed areas of the substrate, or can be soft boundaries between areas of the substrate to be exposed at differing doses of radiation (so called "grey-scaling").

The scan direction can be selected so that the total length of the image feature boundaries are resolved orthogonally to the scan direction.

In one example, instead of selecting the scan direction to minimize the data transfer requirement for any single image frame loading operation, it is possible to select a scan direction that minimizes the total data requirement for all frame loading operations required to scan the target portion. For instance, the scan direction can be selected so that the total length of the image boundaries resolved parallel to the scan direction is equal to or greater than the total length of image boundary resolved orthogonally to the scan direction.

In one example, the data transfer requirement can be reduced by dividing an image to be transferred to the target portion of a substrate in to two or more image portions that are scanned separately in respective scan stages. Any increase in time required to scan the image as a result of performing the scan in a plurality of scan stages can be more than outweighed by the results of a reduced data transfer requirement. Thus, the image to be projected on to the target portion can be divided in to at least first and second image portions. The scanning operation can be performed in respective scan stages. For example, at least a first scan stage projecting the first image portion on to the target portion of the substrate and at least a second scan stage projecting the second image portion on to the target portion of the substrate. In one example, a maximum number of individually controllable elements of the array that are addressed as any single frame is loaded during each scan stage is less than the maximum number of individually controllable elements of the array that are addressed as any single frame is loaded if the image as a whole is scanned in a single stage.

In one example, the first image portion is scanned in a first scan direction, which minimizes the number of elements of the array of individually controlled elements that change state as any single frame is loaded during the first scan stage.

In one example, the second image portion is scanned in a second scan direction selected to minimize the number of individually controllable elements of the array that change state as any single frame is loaded during the second scan stage.

In some cases it can be appropriate to scan different image portions in directions that are parallel to one another, and in other cases appropriate scan directions can be oblique to one another. In many cases it is expected that appropriate scan directions will be orthogonal to one another as many typical images comprise rectilinear features extending in two orthogonal directions.

The appropriate scan directions can be selected relative to image feature boundaries in the manner described above.

Similarly, scan directions can be selected to minimize the maximum date transfer requirements for loading any single image frame or alternatively to reduce the total data transfer requirement for transferring the image as a whole. For instance, there can be cases in that the ability to deliver data at required rates is not itself a problem, but in that it is nevertheless desirable to reduce the number of changes of state of individual elements of the array in order to minimize aging of elements of the array, and possibly to minimize significant differences in aging between different elements of the array.

In one example, the present invention can be regarded as particularly suited to pixel grid imaging methods in that the image is projected on to the substrate as an array of image pixels. For example, illuminated micro spots projected by respective lenses of a microlens array that are scanned across the surface of the substrate to "write" the desired image. However, step and scan exposure methods mentioned above can also be used. For instance, in a step exposure method elements of an array of individually controllable elements can be addressed between two successive exposure steps.

According to another embodiment of the present invention there is provided a lithographic apparatus comprising an illumination system, an array of individually controllable elements, a projection system, and an addressing device. The illumination system supplies a beam of radiation. The array of individually controllable elements patterns. The projection system projects the patterned beam onto a target portion of a substrate, The addressing device periodically addresses elements of the array of individually controllable elements in an image frame loading operation to set the state of each individually controllable element appropriate to the pattern to be projected. Only those individually controllable elements that must change state are addressed each time an image frame is loaded.

In one example, the addressing device is a matrix addressing device adapted to determine that elements of the array must change state between any two image frames and to address corresponding elements appropriately.

According to another embodiment of the present invention there is provided a device manufacturing method comprising the following steps. Patterning a beam of radiation using an array of individually controllable elements. Projecting the patterned beam of radiation onto a target portion of a substrate. Providing image data to the array of individually controllable elements for periodic updating of the pattern to be projected. Periodically addressing individual elements of the array of individually controllable elements in an image frame loading operation to set a state of each individually controllable element appropriate to the pattern to be projected in accordance with the image data. The image data comprising data pertaining only to those individually controllable elements that must change state from one image frame to the next.

In some cases there can be no difficulty in transferring the required data from drivers of the array of individually controllable elements (for instance including a buffer) in order to address every single element of the array of individually controllable elements in each image frame loading operation. However, there can still be a problem in delivering the required data to the array if the image data for each frame update includes data pertaining to every single element of the array.

In one example, the image provided to the array comprises only data pertaining to those elements of the array that must change state from one image frame to the next. Thus, although each element of the array can actually be addressed by the array drivers each time a frame is loaded, the data that is transferred to the array, for instance from an image file storage device, contains only data relating to elements of the array that must change state between frames.

In some circumstances there is no particular difficulty in supplying the required data from the drivers of the array in order to address each element of the array each frame loading operation. Even so, it can be desirable to address only those elements of the array that are required to change state from one frame to the next in order to maximize the lifetime of the array.

Another embodiment of the present invention provides a lithographic apparatus comprising an illumination system, an array of individually controllable elements, a projection system, and an image providing device. The illumination system supplies a beam of radiation. The array of individually controllable elements patterns the beam. The projection system projects the patterned beam onto a target portion of a substrate. The image providing device provides image data to the array of individually controllable elements for periodic updating of the pattern to be projected. The array of individually controllable elements includes an addressing device that periodically addresses elements of the array in an image frame loading operation to set a state of each individually controllable element appropriate to the pattern to be projected. The image providing device provides image data provides data pertaining only to elements of the array that must change state from one image frame to the next.

For example, in an apparatus according to this aspect of the invention each element of the array of individually controllable elements can change state each time a new image frame is loaded on to the array. However, only data pertaining to elements of the array that must change state from one image frame to the next can be sent to the drivers of the array (including a buffer) from a pattern data storage device. This data can then be added to data existing in the buffer of the driver circuitry that contains data to drive every element of the array to a state appropriate to the preceding image frame. The amount of data transferred (i.e., the image data requirement) to the array is therefore greatly reduced.

One embodiment of the present invention provides a device manufacturing method comprising the following steps. Patterning a beam of radiation using an array of individually controllable elements. Projecting the patterned beam of radiation onto a target portion of the substrate. Providing image data to the array from a digital image storage device for periodic updating of the pattern to be projected. Periodically addressing individual elements of the array of individually controllable elements in an image frame loading operation to set a state of each individually controllable element appropriate to the pattern to be projected in accordance with the image data. The image data relates only to elements of the array that must change state from one image frame to the next.

In another embodiment of the present invention there is provided a lithographic apparatus comprising an illumination system, an array of individually controllable elements, a projection system, and a data path. The illumination system supplies a beam of radiation. The array of individually controllable elements pattern the beam. The projection system projects the patterned beam onto a target portion of a substrate. The data path provides image data to the array from a digital image storage device for periodic updating of the pattern to be projected. The array of individually controllable elements includes a device that periodically addresses elements of the array in an image frame loading operation to set a state of each individually controllable element appropriate to the pattern to be projected. The image data comprises data relating only to those elements of the array that must change state from one image frame to the next.

Further embodiments, features, and advantages of the present inventions, as well as the structure and operation of the various embodiments of the present invention, are described in detail below with reference to the accompanying drawings.

It is to be appreciated that the Summary sets for one or more exemplary embodiments and/or examples, but not all embodiments and/or examples, of the present invention, and thus should not be seen to be limiting the present invention, or the appended claims, in any way.

BRIEF DESCRIPTION OF THE DRAWINGS/FIGURES

The accompanying drawings, that are incorporated herein and form a part of the specification, illustrate the present invention and, together with the description, further serve to explain the principles of the invention and to enable a person skilled in the pertinent art to make and use the invention.

FIG. 1 depicts a lithographic apparatus, according to one embodiment of the present invention.

Figure 2:
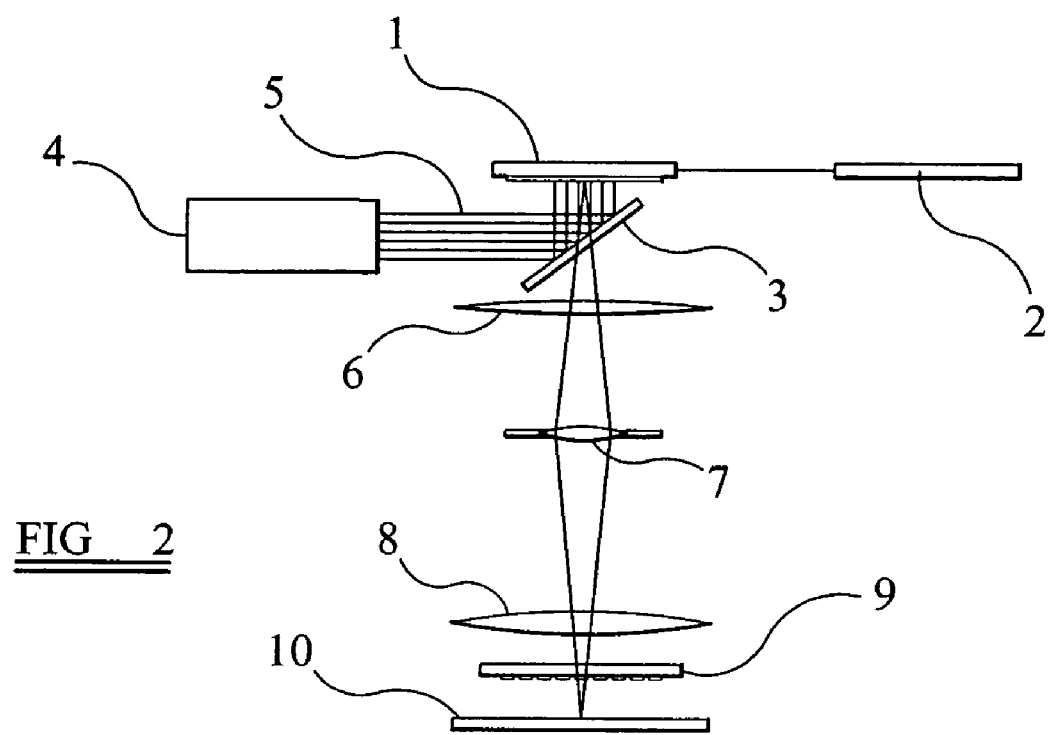

FIG. 2 schematically depicts components of a lithographic projection apparatus incorporating an array of lenses each of that is arranged to project a spot of radiation onto the substrate, according to one embodiment of the present invention.

Figure 3:
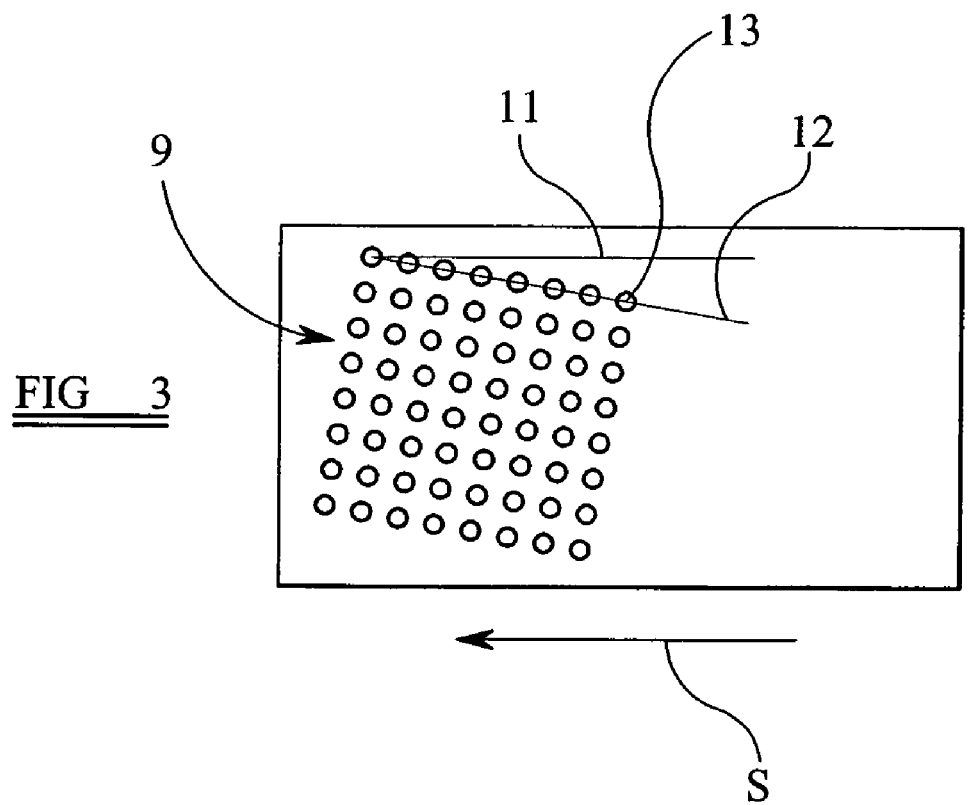

FIG. 3 schematically represents the disposition of spots of radiation projected by the lens array of FIG. 2, according to one embodiment of the present invention.

FIGS. 4a to 4d schematically represent four stages of exposure of a substrate scanned under the lens array of FIG. 2 to transfer a rectangular image to the substrate, according to one embodiment of the present invention.

Figure 4A:
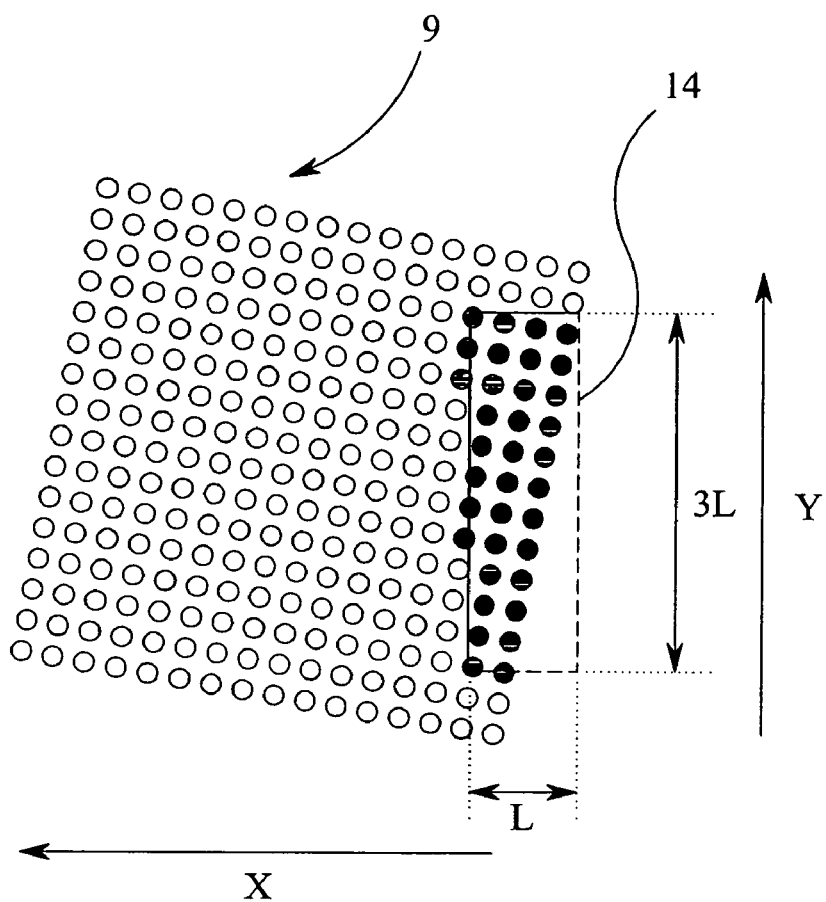
Figure 4B:
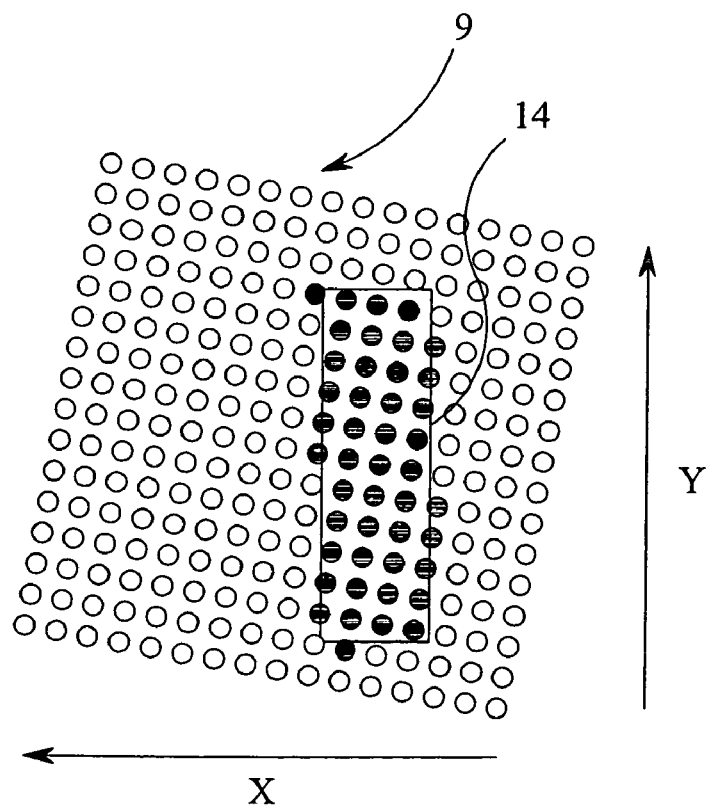
Figure 4C:
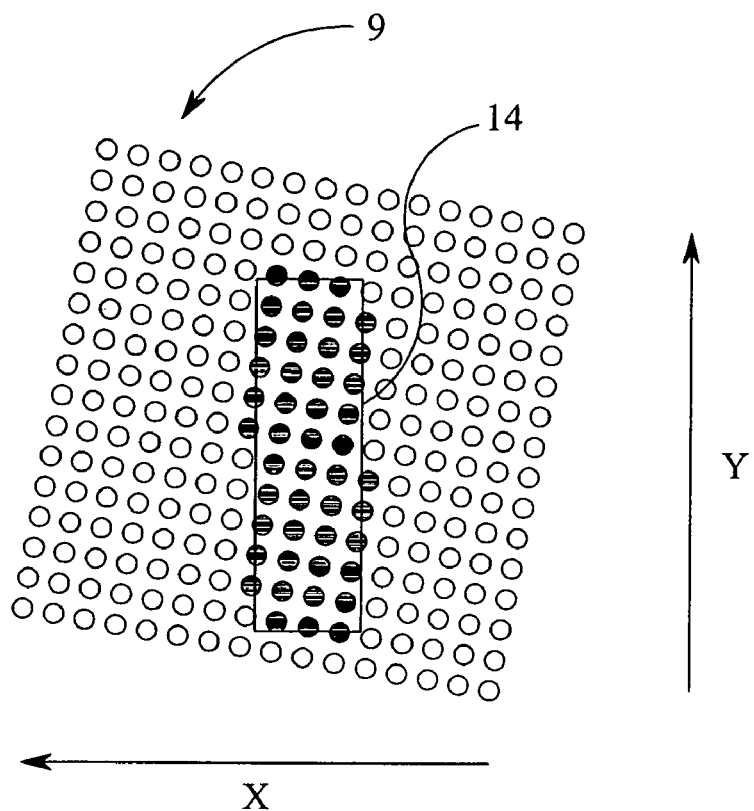
Figure 4D:
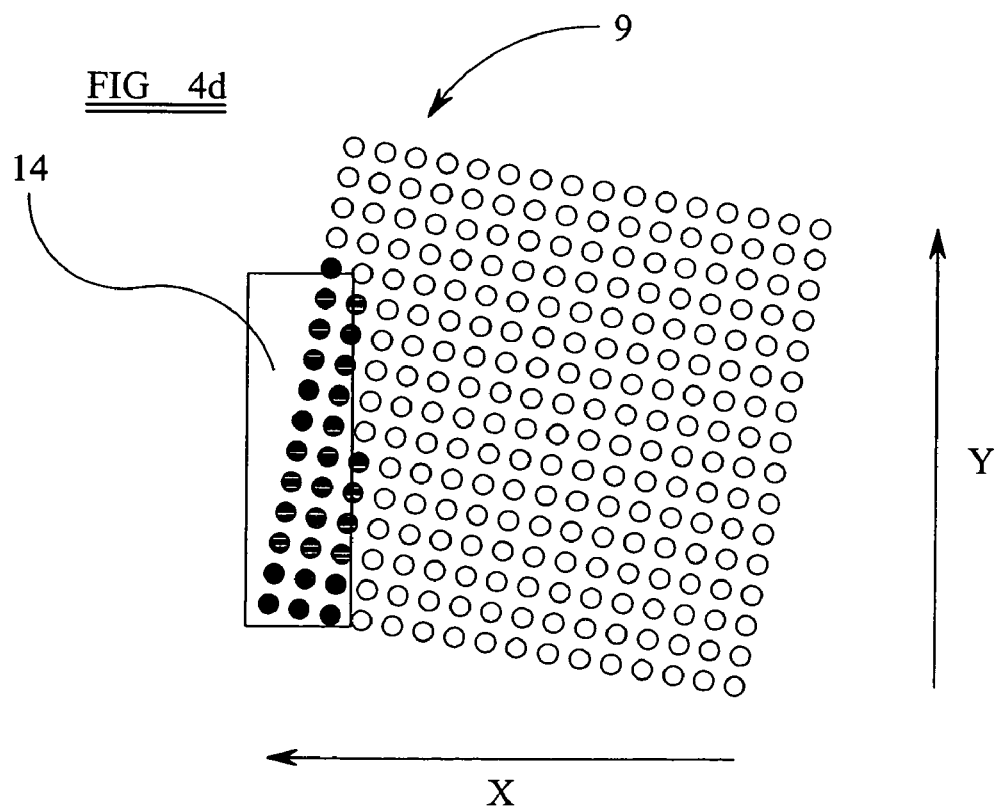
Figure 5:
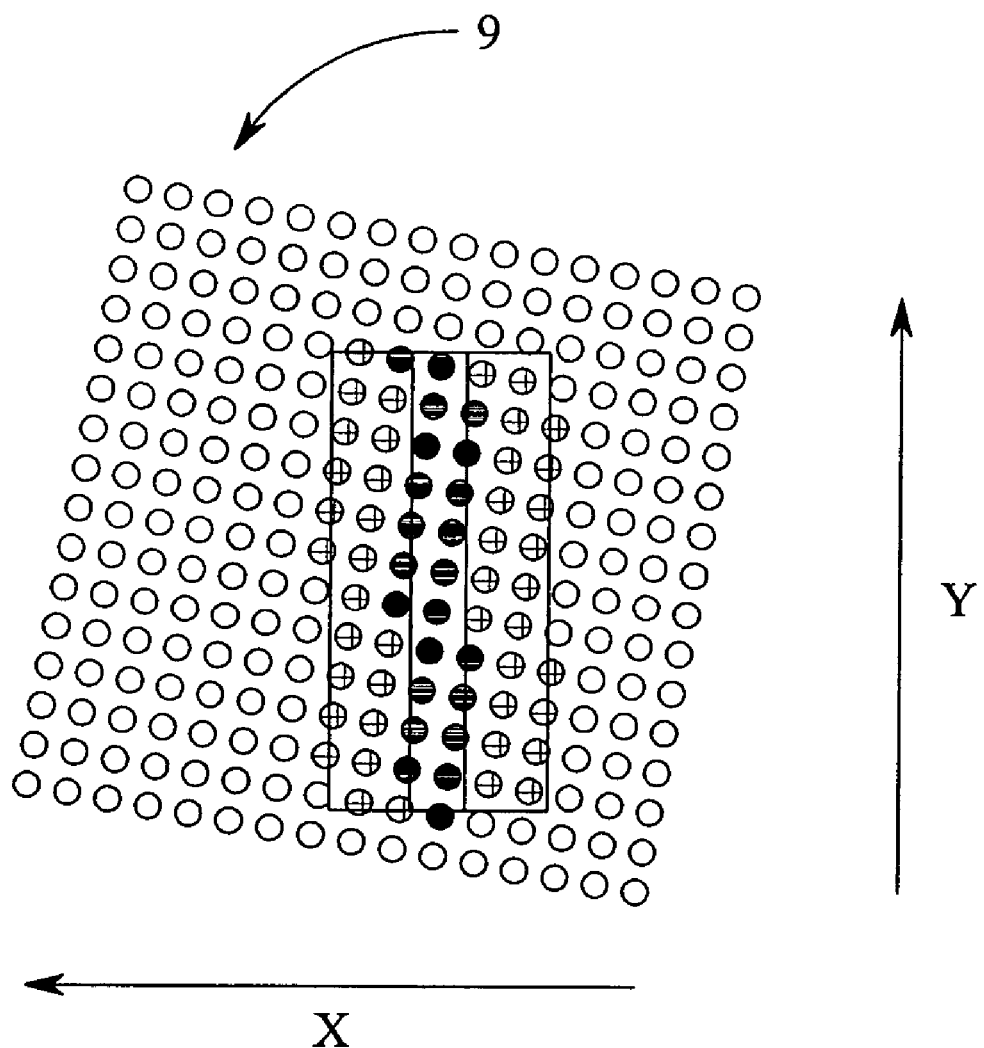

FIG. 5 is an overlay of two of the exposure stages illustrated in FIGS. 4a to 4d, according to one embodiment of the present invention.

Figure 6:
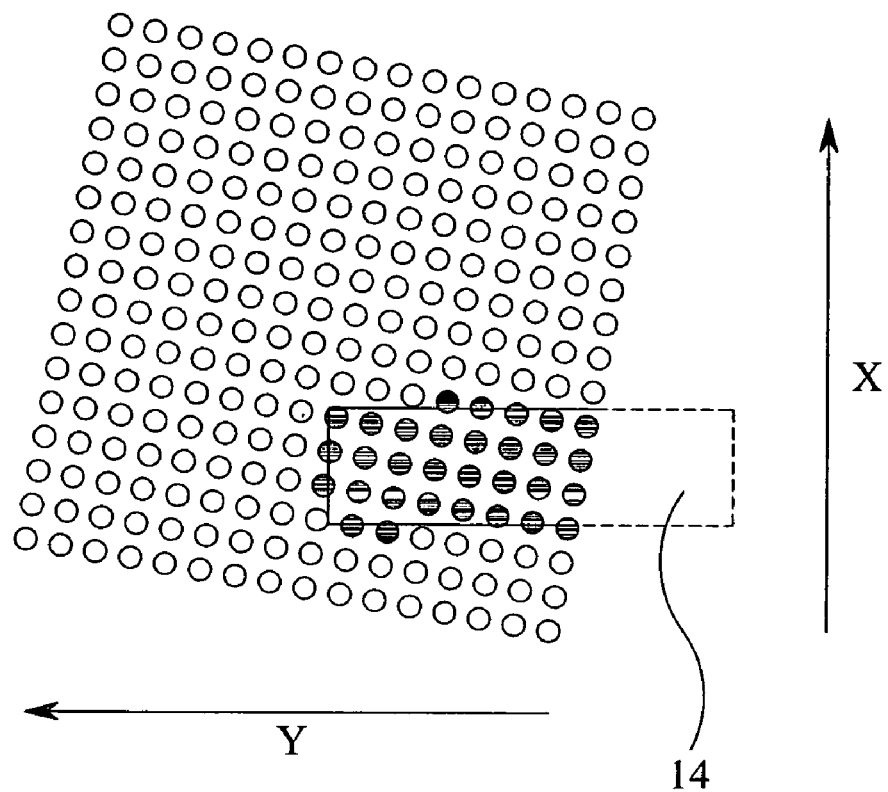

FIG. 6 schematically illustrates transfer of the image of FIGS. 4 and 5 when scanned in an alternative scan direction, according to one embodiment of the present invention.

Figure 7:
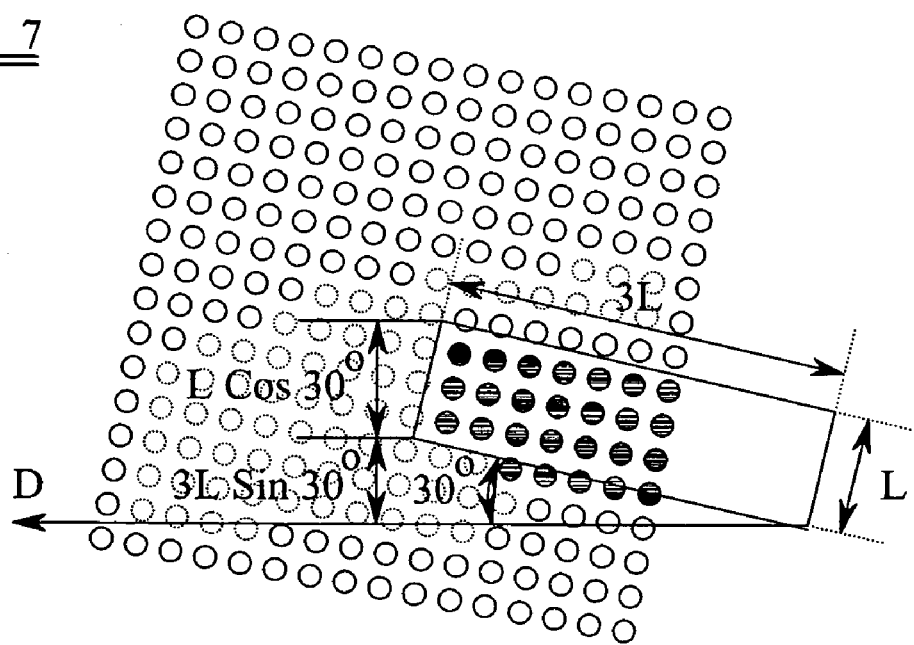

FIG. 7 schematically illustrates transfer of the image of FIGS. 4 and 5 when scanned in an alternative scan direction, according to one embodiment of the present invention.

Figure 8:
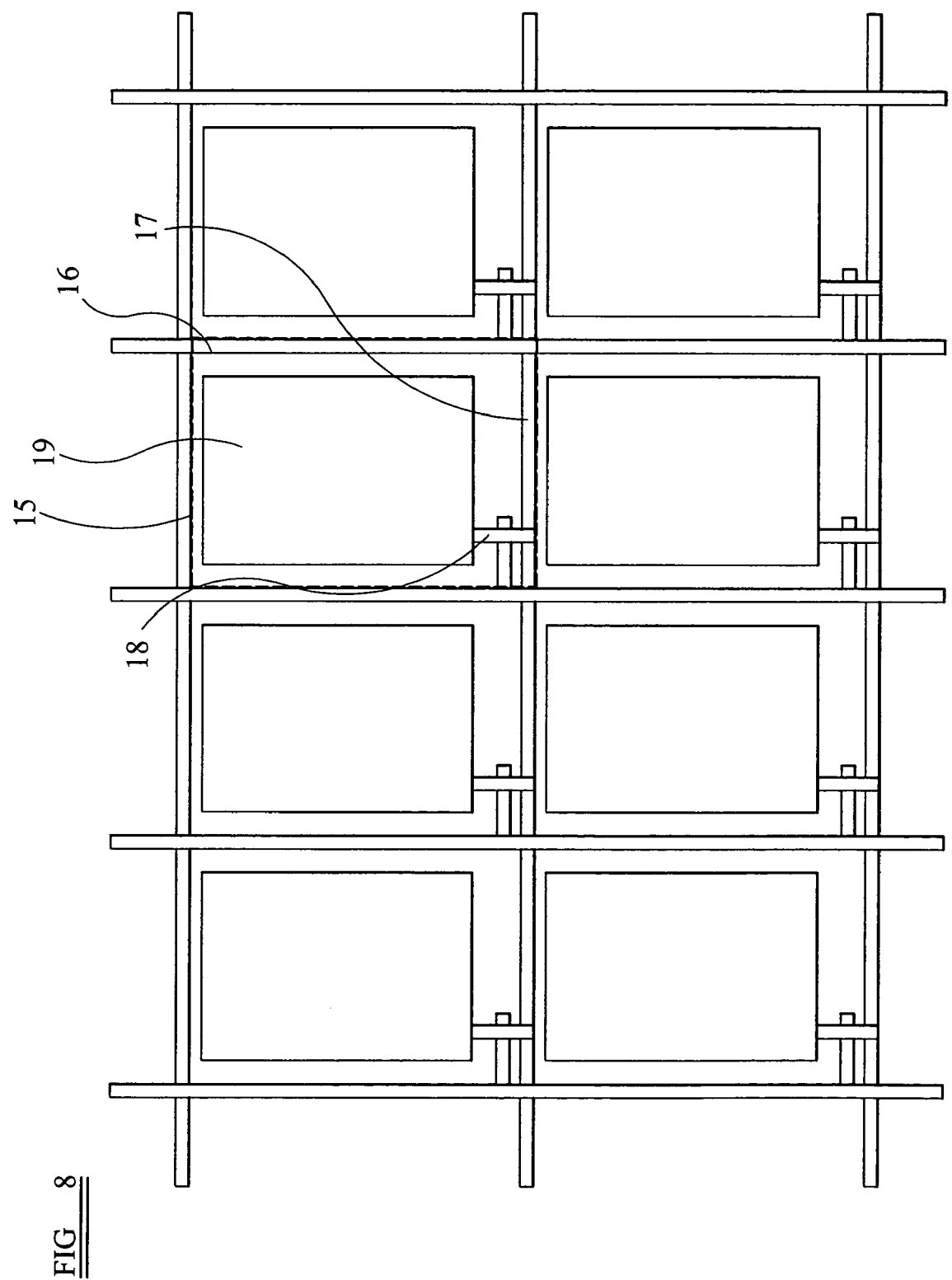

FIG. 8 schematically illustrates an example of an arrangement of repeating image units of an Active Thin Film Transistor pixel array formed on a substrate during manufacture of an FPD, such as a TFT LCD, according to one embodiment of the present invention.

Figure 9:
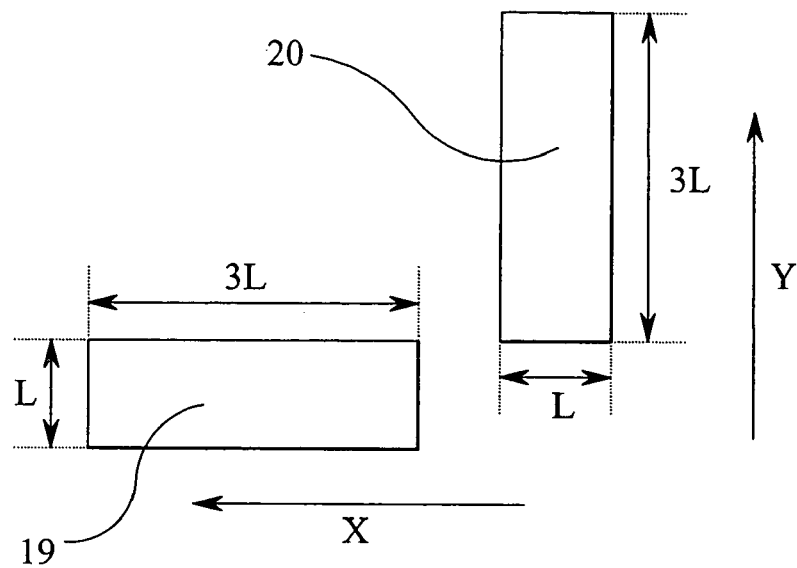

FIG. 9 schematically illustrates transfer of an image comprising two separate image elements by scanning different portions of the image in different scan directions, according to one embodiment of the present invention.

Figure 10:
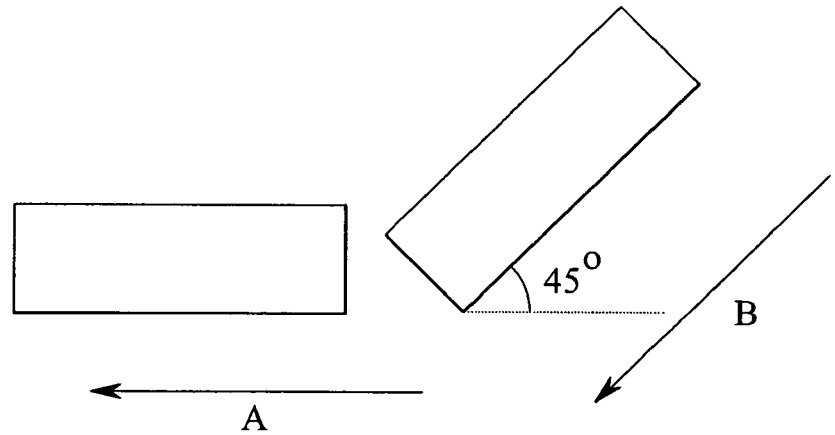

FIG. 10 schematically illustrates transfer of an image comprising two separate image elements by scanning different portions of the image in two different scan directions, according to one embodiment of the present invention.

Figure 11:
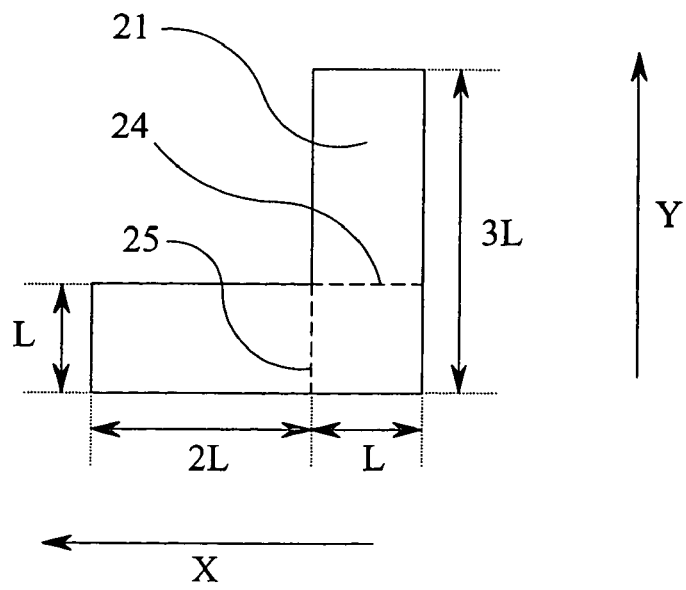

FIG. 11 schematically illustrates a simple "L" shaped image element to be scanned, according to one embodiment of the present invention.

Figure 12A:
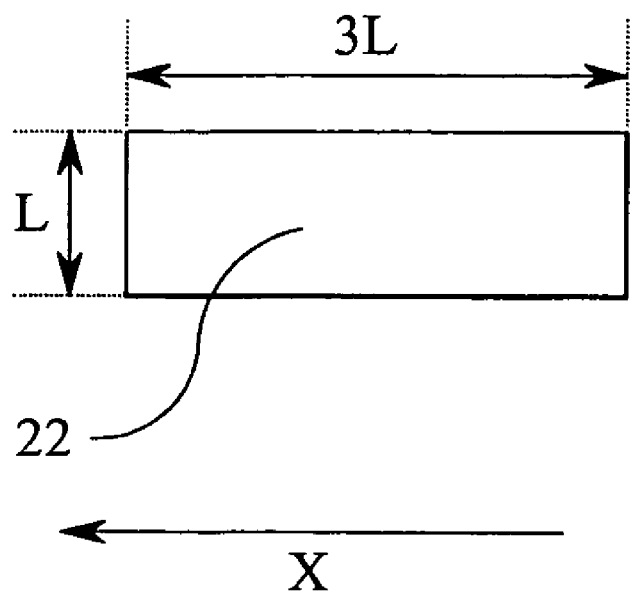
Figure 12B:
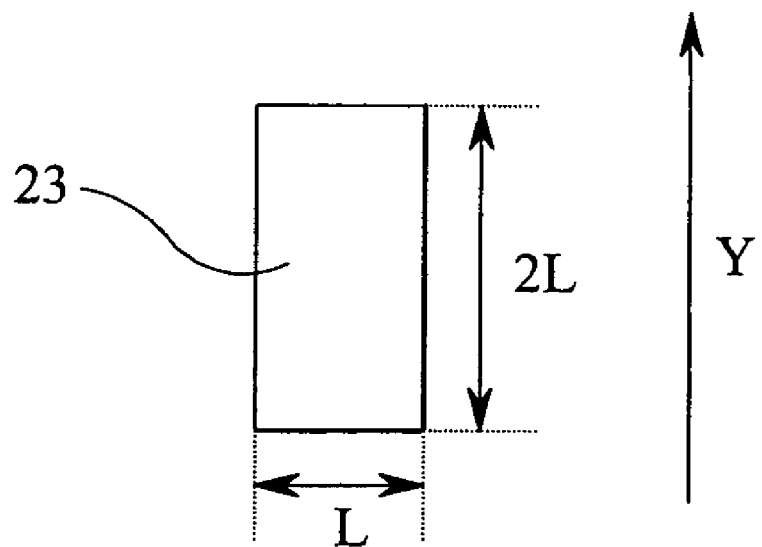

FIGS. 12a and 12b schematically illustrate exposure of a substrate in two scan stages to transfer the image of 11, according to one embodiment of the present invention.

Figure 13A:
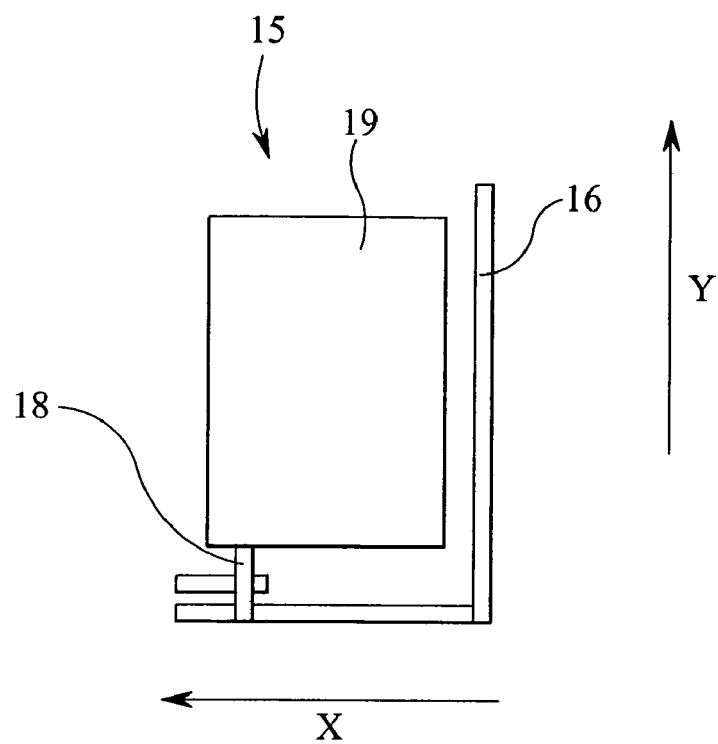

FIG. 13a schematically illustrates a single image unit of the repeating image of FIG. 8, according to one embodiment of the present invention.

Figure 13B:
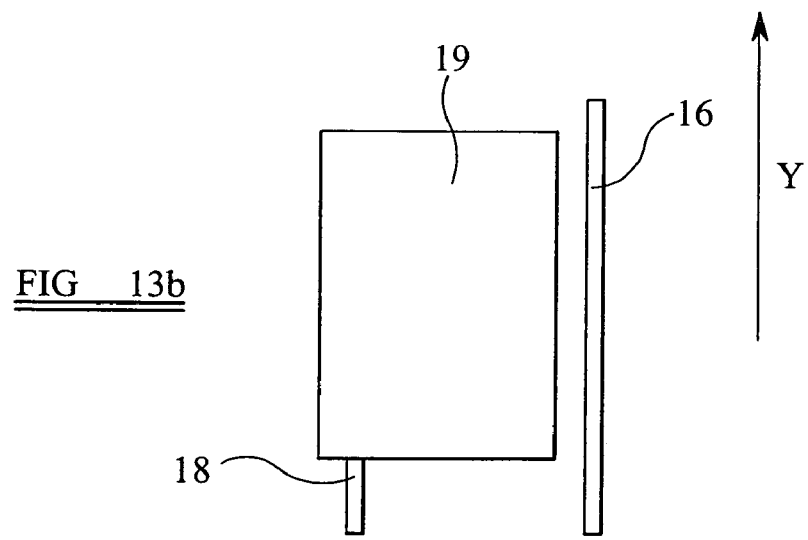
Figure 13C:
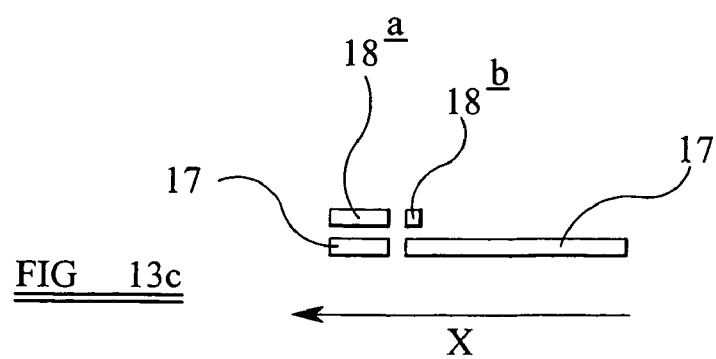

FIGS. 13b and 13c schematically illustrate transfer of the image unit of FIG. 13a to a substrate by dividing the image into two portions for scanning in two different directions, according to one embodiment of the present invention.

The present invention will now be described with reference to the accompanying drawings. In the drawings, like reference numbers can indicate identical or functionally similar elements.

DETAILED DESCRIPTION OF THE EMBODIMENTS

Overview and Terminology

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multilayer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of that can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in that the eventual pattern formed on each part of the substrate is built up over a given period of time or a given number of exposures during that the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multilayer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultraviolet (EUV) radiation (e.g., having a wavelength in the range of 520 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), that in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for that the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), that are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion that is capable of supporting substrate 114. This is conventionally referred to as an air bearing arrangement. Substrate 114 is moved over substrate table 106 using one or more actuators (not shown), that are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in that M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use can also be employed.

As discussed above, current technology may not allow construction of a single SLM that can provide the massive array of pixels necessary to give the throughput required in many applications. Thus, typically a multiple SLM array (MSA) in used in parallel to provide the number of pixels needed. For example, the pixels from different SLMs of the MSA are "stitched" together to form a cohesive image on the substrate. This can be done using motion control and gray scaling techniques. In the following description, for most instances, a reference to an SLM can also be interpreted as including an MSA.

Regardless of the operation mode used, the pattern generated by the SLM (i.e., the "on" or "off" state of each of the individually controllable elements—hereinafter referred to as "SLM pixels") are periodically updated to transfer the desired image to the substrate. For example, as mentioned above, in pulse mode the SLM pattern is updated as required between pulses of the radiation system. In continuous scan mode, the SLM pattern is updated as the beam scans across the substrate. In step mode and scan mode, the pattern can be updated between each step or scan operation.

The SLM can be regarded as part of a pattern generation subsystem that replaces a conventional reticle. In addition to the SLM, the image generation subsystem comprises driving electronics for the SLM pixels and a data path. Input image data is transformed into a suitable format and fed to the SLM by the data path. The drive electronics addresses each SLM pixel in sequence as the SLM pattern is updated, i.e., each new SLM image frame can be loaded by normal matrix addressing. The frame rate, i.e., the time required to load each new frame onto the SLM, is a determining factor on apparatus throughput.

The ability to deliver data at a sufficiently high rate is therefore an important consideration in attaining desired substrate scan speeds, and thus production rates. For instance, in the case of flat panel display (FPD) production the apparatus typically operates in pulse scan mode with lasers pulsing at 50 KHz with 10/20 nsec pulse duration. The high frequency is used to provide acceptable throughput because of the large substrate areas that must be scanned to produce FPDs. To load an SLM frame between pulses at this frequency can require data transfer rates of the order of about 10 to 100 Gpixels/sec or more. Very complicated and expensive data handling and driver systems are required to handle such high data transfer rates. In addition, with such high data transfer rates the chance of data errors occurring is proportionately non-negligible.

As discussed below, one or more embodiments and/or examples of the present invention addresses this problem by reducing the data transfer requirement.

Unless otherwise specified, through the rest of this description, the term "data transfer requirement" is to be understood to mean the amount of data that must be transferred to the SLM for updating the image frame.

FIG. 2 shows a lithography system, according to one embodiment of the present invention. By reducing the data transfer requirement it is possible either to reduce the required data transfer rate without increasing the frame rate, or alternatively it is possible to reduce the frame rate for any given data transfer rate. The apparatus shown in FIG. 2 comprises an SLM 1 that receives image data from a controller 2. A beam splitter 3 is positioned beneath the SLM 1 and receives radiation 5 from an illumination source 4. The beam of radiation 5 is reflected on to the lower surface of the SLM 1. A single SLM pixel is shown in an "on" state, i.e., as reflecting a component part of the beam back through the beam splitter 3 and projection optics defined by lenses 6, 7 and 8. The lowermost lens 8 is a field lens that produces a substantially telecentric beam, that is directed towards a micro lens array 9. The micro lens array 9 comprises a two-dimensional array of small lenses, each of that is arranged so as to focus light incident upon it on to an upper surface of a substrate 10. Thus, for each of the SLM pixels in an "on" state (i.e., that acts as a mirror) a respective one of the lenses in the array 9 is illuminated, and a respective spot of light is projected by that lens in the array 9 on to the upper surface of the substrate 10.

The image controller 2 comprises the data path, and will typically include storing device for storing a "mask file" and a rasterizer. The storing device contains the entire image to be printed on the substrate. The rasterizer converts appropriate portions of the image for loading on to the SLM into a bit map of SLM pixel values representing the pattern required to transfer the desired image to the substrate. The controller will typically also comprise one or more frame buffers and other conventional components necessary for matrix addressing of the SLM each time a new SLM frame is loaded. Appropriate image digitization and SLM drive electronics will become apparent to one of ordinary skill in the art. For instance, the image controller can be very similar to a bit map based mask-writer, but with appropriate matrix addressing drive circuitry for addressing individual SLM pixels of the particular type of SLM used.

FIG. 3 schematically illustrates the relationship between the disposition of individual lenses in the micro lens array 9 of FIG. 2, and the relative direction of movement S of a substrate 10 as the substrate is scanned, according to one embodiment of the present invention. The direction S is parallel to a line 11 that is inclined to a further line 12, which extends parallel to a row of the lenses in the micro lens array 9. Each lens projects light on to a different one of a rectangular array of spots on the substrate, one of that is identified by numeral 13. The array of spots can be regarded as defining substrate pixels. The lenses are arranged in a regular two-dimensional array that is slightly inclined to the direction S as shown, such that the entire surface of the substrate can be exposed by appropriate control of the illumination beams delivered to respective lenses by respective SLM pixels. Each lens can in effect "write" a continuous line on the surface of the substrate 10, and given the disposition of the lenses relative to the direction of substrate movement, those lines are sufficiently close together to overlap. In order to expose a selected two-dimensional area of the substrate, the substrate is advanced beneath the micro lens array 9 and the individual lenses, beneath that the area to be exposed is positioned at any one time are illuminated by rendering the associated SLM pixels reflective.

In one example, the instantaneous pattern projected on to the substrate 10 at any given moment in time therefore comprises an array of illuminated spots corresponding to the pattern generated by the SLM at that moment in time, i.e., the frame loaded onto the SLM. As mentioned above, the SLM frame is periodically updated to ensure that at any given moment of time the correct pattern corresponding to the portion of the image being "written" at that time is projected on the appropriate area of the substrate as the substrate 10 moves relative to the MLA 9 in the direction S.

FIGS. 4a to 4d are "snap shots" of four instants in time illustrating four sequential stages of scanning a simple black and white rectangular image 14 on to the substrate, according to various embodiments of the present invention. The image is "black and white" in the sense that all areas of the image to be exposed. For example, "black" areas depicted in the Figures receive the same dose of radiation. The image 14 is of width L and length 3L. The image 14 is scanned in a scan direction X, which is defined relative to the image. That is, the substrate 10 will be positioned on the substrate table so that the scan direction X coincides with the direction S, taking into account the appropriate orientation of the image on the substrate. Accordingly, the term "scan direction" is understood to be a direction defined relative to the image to be scanned and that will be aligned with the direction of movement of the substrate relative to the MLA.

It will be appreciated that FIGS. 4a to 4d are schematic and no attempt is made to correctly represent the scale of the array of spots (i.e., substrate pixels) or the size of individual spots 13, in comparison to the size of the image 14. For example, the array can typically comprise of the order of 612×1024 spots each having a diameter of about 1.5 μm, with each spot being spaced about 300 μm from its nearest neighbors. The array will typically be tilted at very small angle to the direction of substrate movement S, for instance about 0.15°. The line width of typical pattern to be printed is of the order of about 3 to 10 μm, for example, for FPD workpieces.

In the embodiments shown in FIGS. 4a to 4d, the illuminated spots corresponding to SLM pixels are in an "on" state at each of the four instants in time respectively are shaded. Spots that are not illuminated at that instant in time are also illustrated to show clearly how the image is transferred to the target portion of the substrate as the substrate is scanned below the MLA by turning appropriate SLM pixels "on" and "off," but it will be appreciated that only those spots shown shaded are actually "on" and thus projected on to the substrate 10 at the given instant in time.

FIG. 4a shows the position at a time shortly after the target portion of the substrate 10 to be exposed with the image 14 has begun to pass under the MLA 9. FIG. 4b shows the position at a subsequent instant in time at that all of the target portion of the substrate 14 lies beneath the MLA 9. FIG. 4c shows the position a short time later. FIG. 4d shows the position at a further instant in time at that the target portion of the substrate 10 has begun to move out from under the MLA 9. For clarity, the image 14 and target portion of the substrate are shown in outline only.

FIG. 5 shows the positions of the substrate target portion shown in FIGS. 4b and 4c that are overlaid, according to one embodiment of the present invention. The image 14 is again shown in outline only. Although it can be necessary to continually update the SLM pattern as the substrate 10 moves beneath the MLA 9, not every SLM pixel must change state between successive SLM frames. As illustrated, only those spots (corresponding to respective SLM pixels) shown with a cross must change state between SLM frames corresponding to those two positions. For frames corresponding to these two target portion positions, and any frames in between, the SLM pixels common to both positions (shown as highlighted spots) do not need change state but can remain "on." Similarly, those SLM pixels corresponding to spots lying outside both image positions do not need to change state but rather can remain off as illustrated.

In one or more of the above embodiment are addressed only those SLM pixels whose state is required to change each time a fresh SLM frame is loaded. The number of pixels changing state between two successive frames can be a small fraction of the total SLM pixels (and in some cases can be zero). Accordingly, these embodiments can significantly reduce the amount of data to be transferred to the SLM as each frame is loaded, i.e., significantly reducing the required data transfer rate and/or frame rate.

For example, with conventional matrix addressing as referred to above, image frames can be represented as a data matrix of 1's and 0's, each "1" representing an SLM pixel that is to be set in an "on" state and each "0" representing an SLM pixel that is to be set in an "off" state. Each pixel of the SLM is then addressed in accordance with the data matrix. In contrast, in one or more embodiments of the present invention, there can be a similar data matrix, but in this case each "1" can represent an SLM pixel that is to change state and therefore is to be addressed. Each "0" of the data matrix will represent an SLM pixel that does not need to change state and therefore need not be addressed.

As an image is scanned, the only SLM pixels that will be addressed in accordance with this embodiment of the present invention are those that cross an image boundary between successive SLM frames. The number of pixels that must be addressed as any one frame is loaded, and thus the required data delivery rate and/or frame rate, corresponds to the total length of image boundary extending in a direction orthogonal to the scan direction and passing beneath the MLA 9 as that frame is loaded. Thus, the maximum data transfer requirement for loading a single frame (i.e., the maximum number of SLM pixels that must change state between any two successive frames and therefore need to be addressed when updating the SLM) is determined by the maximum image boundary length orthogonal to the scan direction that can lie beneath the MLA 9 at any given time (taking into account the area of the substrate covered by the MLA 9 relative to the size of the image). With reference to FIGS. 4 and 5, this equals 6L (where 3L is the length of the rectangular image 14).

In one example, the data transfer requirement, and thus the maximum data transfer rate and/or frame rate required to transfer any given image to the substrate, can be further reduced. This can be done by selecting the image scan direction so as to reduce, and desirably minimize, the number of SLM pixels that must change state (and therefore be addressed) as any single SLM frame is loaded. This can be achieved by selecting the scan direction, such that the maximum image boundary length that can extend orthogonal to the scan direction beneath the MLA at any given instant in time is reduced, and possibly minimized. With the simple rectangular image shown in FIGS. 4 and 5, this is done by scanning the image in a direction Y that is orthogonal to the scan direction X of FIGS. 4 and 5.

FIG. 6 illustrates selection of a scan direction Y to minimize the maximum data transfer requirement for loading a single frame, according to one embodiment of the present invention. This figure shows the scan direction Y aligned with substrate movement direction S. This figure also shows the maximum boundary length orthogonal to the scan direction Y lying beneath the MLA 9 at any given instant in time corresponds to 2L, where L is the width of the rectangular image 14.

FIG. 7 illustrates scanning the image 14 in a scan direction D extending 30° to the X direction, according to one embodiment of the present invention. It will be appreciated that other scan directions lying between X and Y will have a reduced data transfer requirement compared to scan direction X. Here the maximum number of SLM pixels that must be addressed in any given frame loading operation is determined by the length of boundary beneath the MLA 9 resolved in a direction orthogonal to the scan direction. Thus, the relevant resolved boundary length is 2L cos 30°+6L sin 30°, which equates to approximately 4.7L, compared to 6L for the scan direction X.

For a particular image of an arbitrary shape it will be possible to select a scan direction, or in some cases more than one direction, that minimizes the maximum number of pixels that can need to be addressed between any two successive frames. This can be done by selecting a scan direction that minimizes the total length of image boundary, resolved in a direction orthogonal to the scan direction, which can lie below the MLA at any one time. If the MLA is large enough with respect to the image to cover the entire image, then this is simply the total boundary length of the image as a whole, again resolved in a direction orthogonal to the scan direction.

In one example, the scan direction that minimizes the total number of SLM pixel address operations required to scan the entire image will not necessarily correspond to the scan direction that minimizes the maximum number of SLM pixels that can need to be addressed when loading a single frame. For instance, consider an MLA array that extends a distance d in the direction of substrate movement S being used to scan a simple square image of side L. If the length L is less than d, then the optimum scan direction (or in this case directions) to reduce the maximum data transfer for loading any single SLM frame will be parallel to one side of the square. This can be because the MLA is in this case large enough to cover the entire square image, which is the total boundary length orthogonal to the scan direction being 2L.

In one example, a scan direction can be parallel to a diagonal of the square image. If the diagonal of the square is greater than d, the maximum length of boundary resolved in a direction orthogonal to the scan direction and that can lie beneath the MLA at any one time will equal 2d (i.e., 2d tan 45°). Thus, in this case, if L is greater than 2d, the maximum boundary length orthogonal to the scan direction that can lie beneath the MLA at any given time is minimized by scanning the image in a direction parallel to a diagonal of the square. Hence, in such a case the maximum data transfer rate and/or frame rate required is minimized by scanning this particular image in the direction of the diagonal. Although, this can increase the overall data requirement for scanning the entire image. For example, the total boundary length orthogonal to the diagonal scan direction for the image as a whole is 4L cos 45°, i.e., approximately 2.8L.

In one example, the image to be transferred to the substrate will generally comprise a number of repeating image units. In addition, the image, or each image unit, can comprise a single image element of can be a composite of a number of discrete image elements. Application of one or more embodiments of the present invention to reduce or minimize the data transfer requirement will generally be based upon consideration of a single image unit.

FIG. 8 schematically represents a portion of an image that can be formed on a substrate during the manufacture of an FPD, according to one embodiment of the present invention. For example, an Active Matrix Thin Film Transistor pixel array for making an FPD such as a TFT LCD. Typical images to be scanned will be largely rectilinear, for instance composite image units each made up of rectilinear image elements. The overall image is made up of a plurality of repeating image units 15 (shown in broken lines) each comprising part of a data line 16, part of a gate line 17, a thin film transistor 18 and an FPD pixel electrode 19. Depending on the relative dimensions of the various image features, the single scan direction that will reduce the maximum required data transfer rate will be parallel to either data line 16 or gate line 17. In this embodiment, the scan direction will be parallel to the date line 16 since the image unit 15 is elongated in this direction.

FIG. 9 shows a simple composite image comprising two rectangular image elements 19, 20, each having a width L and length 3L, according to one embodiment of the present invention. In this embodiment, the first image element 19 extends orthogonal to the second 20. Two possible orthogonal scan directions X and Y are parallel to each of the rectangular image elements 19,20 long sides, respectively. From the above, it will be appreciated that the total number of SLM pixels that will be addressed to scan the entire image, and also the maximum number of pixels that will be addressed when loading any particular frame, are the same regardless of whether the image is scanned in the X direction or the Y direction. However, the data transfer requirement can be minimized by scanning the image in two stages, a first scan stage in the X scan direction scanning the image element 19 only, and a second scan stage in the Y direction scanning the image element 20 only.

In one example, the image is scanned as a whole in one scan the maximum boundary length orthogonal to the scan direction. For example, that is either the X or Y scan direction, which can lie beneath the MLA at any one time. This can correspond to the maximum number of pixels that must be addressed at any one time. This will be at least 4L, and could be as high as 2×3L+2×L, i.e., 8L, depending on the relative size of the image and MLA. However, by scanning the image in two stages, the maximum length of boundary extending orthogonal to the scan direction in each scan stage equals 2L so that the maximum data transfer requirement for loading a single frame is significantly reduced. In addition, the total number of SLM pixels that are addressed to scan the entire image is also reduced, which corresponds to a total boundary length of each image element orthogonal to the respective scan directions of 4L.

This embodiment involves scanning the image twice, alignment of the image portions should not be problematic as conventional alignment marks positioned on the substrate can be relied upon for appropriate alignment of the substrate for each of the scan directions ensuring high alignment accuracy.

In one example, the image feature fidelity or resolution can be improved in many cases. It will be appreciated from the above description that each pixel projected on the substrate is capable of writing an essentially continuous line along the substrate in the scan direction. Boundaries of the image features that are aligned with the scan direction can therefore be produced with greater fidelity than boundary lines oblique to the scan direction. This will generally result in the longer image boundaries being aligned with the scan direction and therefore having greater fidelity than they would have if scanned in another direction.

With the above example, the two desired scanning directions are orthogonal to one another. This is not necessarily the case for all images. Essentially, this embodiment requires dividing the image (or image unit) into two portions, which correspond to two discrete image elements in the case of FIG. 9. Then, each portion is separately scanned in a respective scan direction, which minimizes the maximum number of SLM pixels that will need to be addressed between two successive SLM frames of either scan stage.

FIG. 10 illustrates one embodiment of the present invention, in which a slight variation of the image shown in FIG. 9. In this embodiment, the image element 20 extends at 45° to the image element 19. In this case, the desired scan directions are shown by arrows A and B and are inclined at 45° to each other rather than 90°. However, as mentioned above, in practice most images will be essentially rectilinear predominantly comprising one or more image elements extending in two orthogonal directions. In this case, it will be possible to divide the image into two portions for scanning in two separate orthogonal directions. A first portion can have a total image boundary length extending in the respective scan direction no less than the total image boundary length extending orthogonally to that scan direction. A second portion can have a total image boundary length extending in the respective scan direction no less than the total image boundary length extending orthogonal to that scan direction.

In one example, the image can be divided into two portions to be scanned in the same (or opposite) direction. Consider for instance two rectangular image elements as illustrated in FIGS. 9 and 10 disposed parallel to one another. In this case, the data transfer requirement can be minimized by scanning each rectangular image element separately from the other, but in the same (or if appropriate opposite) direction.

In this embodiment, the image is divided to be scanned into two separate portions to be scanned in two different scan stages, and possibly in two different directions. With the simple examples given, the two portions of the image comprise discrete image elements making up the complete image (or repeating image unit).

FIGS. 11, 12a, and 12b show individual image elements having features extending in two different directions be split into sub-elements and divided into separate image portions that are scanned in different directions, according to embodiments of the present invention. FIG. 11 shows a simple "L" shaped image. This image corresponds to that of FIG. 9 except that the two rectangles overlap to form limbs of a single L shaped image element 21. Each limb has a length of 3L and a width of L. In this embodiment, the data transfer requirement can be minimized by dividing the image into two portions 22, 23 as shown in FIGS. 12a and 12b. Image portions 22, 23 are then scanned in respective directions orthogonal to one another as indicated by the arrows X and Y. The image portions 21 and 22 of FIGS. 12a and 12b are produced by dividing the image of FIG. 11 along the dotted line 24 illustrated in FIG. 11. It will be appreciated that other dividing lines will produce the same effect on the data transfer requirement, for instance one alternative dividing line 25 is also shown in FIG. 11.

FIGS. 13a, 13b and 13c show embodiments of the present invention directed to the FPD image illustrated in FIG. 8. FIG. 13a shows a single image unit 15 as identified in FIG. 8. In FIGS. 13b and 13c the image unit of FIG. 13a is divided into two portions to be scanned in respective scan directions X and Y as illustrated. Together, the two image portions of FIGS. 13b and 13c form the complete image unit 15 of FIG. 13a. Each image portion shown in FIGS. 13b and 13c is a composite of a number of image elements. With reference to FIG. 13b, the image elements are the pixel electrode 19, thin film transistor part 18, and data line 16. With reference to FIG. 13c, the image elements are parts of the gate line 17 and parts of the thin film transistor 18a/18b. It can be appreciated that the image of FIG. 13a could have been divided in alternative ways to produce slightly different image portions that would nevertheless provide the same reduction in data requirement as those portions illustrated in FIGS. 13b and 13c. For instance, thin film transistor portion 18b is square and could be included in either image portion. Similarly, that portion of the transistor 18 that overlaps the gate line 17 is included in the image portion of 13b but could alternatively have been included with the image portion shown in 13c.

In certain of the embodiments of the invention described above, the image is scanned in two scan stages, and in the illustrated cases, in two different scan directions. In principle it can be possible to further reduce the data transfer requirement for scanning any given image by scanning the image in more than two stages and/or more than two directions. However, in practice it might be that any further reduction in the data transfer requirement can be outweighed by a delay in throughput because of the additional scan stage or stages required.

In the description above the invention has been exemplified by reference to scanning black and white images in that SLM pixels are required to change between only two states. The two states are an "on" state in that the respective pixel is projected on to the substrate and an "off" state in that the respective pixel is not projected on to the substrate. It is also known to control the individually controllable elements of an SLM to provide image "grey-scaling," in other words the dose of radiation projected on to the substrate by any given SLM pixel can be varied between a maximum and a minimum. Clearly each time the grey-scale value of a particular pixel is to change, that pixel must be addressed as the respective SLM frame is loaded. Thus, reference above to the change in state of a pixel should be understood to include any change in pixel state, including a change in grey-scale value of a pixel.

When projecting images that include grey-scaling it is not necessarily appropriate to take account only of hard image feature boundaries (i.e., boundaries between exposed and unexposed portions of the substrate) in determining the optimum scan direction, or scan directions. Rather, it is necessary to consider regions of the image where pixel grey-scale values change. However, different areas of an image having different grey-scale values can be treated as separated by boundaries across that the grey-scale value changes. Accordingly, when applying one or more embodiment of the present invention to such grey-scaled images, the term "boundary" used above should be understood to include boundaries between regions of different grey-scale value, as well as, hard boundaries between exposed and unexposed areas of the substrate.

Reference has been made to scanning an image or image unit to be transferred to the substrate. It will become apparent to one of ordinary skill in the art that it is typically necessary to form any given device from multiple image layers. Accordingly, reference herein to scanning of an image on the substrate can be understood as referring to a single image layer, unless otherwise specified. In other words, each layer of the image can be different and can be scanned differently. It is entirely possible that the optimum image division and/or scanning direction or directions, can differ between different image layers.

In one or more embodiment of the present invention, reduction of the maximum number of pixel address operations required for loading any single frame during a scan stage is desired, in order to reduce the maximum single frame data transfer requirement. However, there can be circumstances in that data delivery is not a problem. For instance, in the future it can well be that data transfer techniques progress to the extent that the data transfer rate no longer represents a rate limiting factor in scan times, even if every pixel of an SLM is addressed each time a frame is loaded.

In one example of the present invention, reduction in the number of times an individually controllable element (e.g., mirror) of the SLM must change state can also be reduced. This will, for example, reduce wear of the particular individual controllable elements moving parts. In this case, this can minimize the total number of SLM pixel address operations for scanning the image as a whole i.e., the total image data transfer requirement. For example, scanning the image in a direction that minimizes the total length of image boundary extending orthogonal to the scan direction, or scanning the image in two or more directions so that the sum of the total image boundary length extending orthogonal to each scan direction is less than that of the image as a whole extending orthogonal to a single scan direction. Alternatively, the desired scan direction or directions can be selected to minimize the maximum number of state changes of any single pixel of the SLM in order to avoid significant differences in ageing between different pixels of the SLM.

In one or more embodiments of the invention described above, each image frame loading operation involves addressing only a subset of the total number of SLM pixels, unless of course every single pixel of the array must be updated between two successive image frames in order to display the desired pattern. However, in some cases there can be no difficulty in transferring the required amount of data to the SLM pixels from image drivers local to the SLM in order to address every single element of the SLM each time a new image frame is loaded. In this case, the one or more embodiment of the present invention can nevertheless be applied to reduce the amount of data required to be transferred to the SLM. For example, the SLM can comprise drivers for each of the SLM pixels and an image buffer for receiving image data from an image file storage device. Although the drive circuitry (including buffer) can operate to address each pixel of the SLM each time a new frame is loaded, in accordance with one or more embodiments of the present invention the data transfer requirement between the image file storage device and the SLM (i.e., buffer in this case) can be reduced by transferring data pertaining only to those SLM pixels that must change state from one frame to the next. This data can then be added to data already existing in the buffer (from a previous image frame), the composite data then being sent to the SLM driver to address each adjustable element and set its state accordingly.

The above description exemplifies the one or more embodiment of the invention as applied to lithographic apparatus including an MLA to project an array of spots that define substrate pixels. However, it will be appreciated that the invention can be applied equally to apparatus in that the SLM pixels are themselves projected on to the substrate to defining substrate image pixels rather than micro spots projected via an MLA. Such systems are often referred to as "coherent" imaging systems and can in principle be operated in a scan mode in the same way as an MLA based system. The one or more embodiments of the present invention will apply to such systems in exactly the same way as it applies to a projection system incorporating an MLA.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A device manufacturing method, comprising:
   patterning a beam of radiation using an array of individually controllable elements;
   projecting the patterned beam of radiation onto a target portion of a substrate; and
   periodically addressing individual elements of the array of individually controllable elements in an image frame loading operation to set a state of each individually controllable element appropriate to the pattern to be projected, such that only those individually controllable elements that must change state are addressed when a given image frame is loaded.

2. The method according to claim 1, further comprising:
   scanning the target portion of the substrate to project an image on to the target portion, the scanning operation being performed by moving at least one of the substrate and the patterned beam of radiation to produce relative movement therebetween in at least a first scan direction.

3. The method according to claim 2, wherein:
   the beam comprises pulses of radiation; and
   each new image frame is loaded between radiation pulses.

4. The method of claim 2, wherein:
   the beam comprises radiation that is continuous during the scanning operation; and
   new image frames are loaded as the patterned beam scans across the substrate.

5. The method of claim 2, wherein the image projected on to the substrate at any instant in time comprises an array of image pixels.

6. The method of claim 5, wherein each image pixel corresponds to a respective one of the array of individually controllable elements.

7. The method of claim 5, wherein the array of image pixels corresponds to an array of secondary image sources for which elements of the array of individually controllable elements act as shutters.

8. The method of claim 2, wherein the patterned beam is projected on to the substrate via a micro lens array producing a corresponding array of radiation spots on the substrate.

9. The method of claim 2, wherein the scan direction is selected to minimize the number of individually controllable elements of the array that must change state as any single image frame is loaded as the target portion is scanned.

10. The method of claim 9, wherein the scan direction is selected relative to the image to be projected during the scan operation taking into account image feature boundaries across the array of individually controllable elements that change state as the target portion is scanned.

11. The method of claim 10, wherein the scan direction is selected so that the total length of the image feature boundaries resolved parallel to the scan direction and which are exposed to the patterned beam of radiation at any instant in time is equal to or greater than the total image boundary length resolved orthogonally to the scan direction and which are exposed to the patterned beam of radiation at any instant in time.

12. The method of claim 10, wherein the scan direction is selected so that the total length of the image feature boundaries resolved orthogonally to the scan direction and which are exposed to the patterned beam of radiation at any instant in time is minimized.

13. The method of claim 10, wherein the scan direction is selected so that the total length of the image feature boundaries resolved parallel to the scan direction is equal to or greater than the total length of image boundaries resolved orthogonally to the scan direction.

14. The method of claim 10, wherein the scan direction is selected so that the total length of the image boundaries resolved orthogonally to the scan direction is minimized.

15. The method of claim 10, wherein the image feature boundaries include hard boundaries defined between areas of the target portion to be exposed and adjacent areas of the target portion that are not be exposed as the target portion is scanned.

16. The method of claim 10, wherein the image feature boundaries include soft boundaries defined between areas of the target portion to be exposed and adjacent areas of the target portion that are not be exposed with different doses of radiation as the target portion is scanned.

17. The method of claim 2, wherein:
   the image to be projected on to the target portion is divided in to at least first and second image portions;
   the scanning operation is performed in respective scan stages;
   at least a first scan stage projects the first image portion on to the target portion of the substrate; and
   at least a second scan stage projects the second image portion on to the target portion of the substrate,
   whereby the maximum number of individually controllable elements of the array that must be addressed as any single frame is loaded during each scan stage is less than the maximum number of individually controllable elements of the array that must be addressed as any single frame is loaded if the image as a whole is scanned in a single stage.

18. The method of claim 17, wherein the first image portion is scanned in a first scan direction that minimizes the number of elements of the array of individually controlled elements that must change state as any single frame is loaded during the first scan stage.

19. The method of claim 17, wherein the second image portion is scanned in a second scan direction selected to minimize the number of individually controllable elements of the array that must change state as any single frame is loaded during the second scan stage.

20. The method of claim 17, wherein the second scan direction is oblique to the first scan direction.

21. The method of claim 17, wherein the second scan direction is orthogonal to the first scan direction.

22. The method of claim 17, wherein the second scan direction is parallel to the first scan direction.

23. The method of claim 17, wherein:
the first and second scan directions are selected relative to the first and second image portions, respectively, taking into account image feature boundaries across the array of individually controllable elements that change state as the respective portion of the image is scanned; and
the first scan direction is selected so that (a) the total length of the image feature boundaries resolved in a direction parallel to the first scan direction, which are exposed to the patterned beam of radiation at any instant in time, is equal to or greater than (b) the total image feature boundary length of the first image portion resolved orthogonally to the first scan direction, which is exposed to the patterned beam of radiation at any instant in time.

24. The method of claim 23, wherein:
the second scan direction is selected so that (a) the total length of the image feature boundaries resolved parallel to the second scan direction, which are exposed to the patterned beam of radiation at any instant in time, is equal to or greater than (b) the total image boundary length of the second image portion resolved orthogonally to the second scan direction, which is exposed to the patterned beam of radiation at any instant in time.

25. The method of claim 23, wherein the image feature boundaries include hard boundaries defined between areas of the target portion to be exposed and adjacent areas of the target portion that are not be exposed as the target portion is scanned.

26. The method of claim 23, wherein the image feature boundaries include soft boundaries defined between areas of the target portion to be exposed and adjacent areas of the target portion that are not be exposed with different doses of radiation as the target portion is scanned.

27. The method of claim 17, wherein:
the first and second scan directions are selected relative to the first and second image portions, respectively, taking into account image feature boundaries across the array of individually controllable elements that change state as the respective portion of the image is scanned; and
the first scan direction is selected so that the total length of the image feature boundaries resolves in a direction orthogonal to the first scanned direction, which are exposed to the patterned beam of radiation at any instant time, is minimized.

28. The method of claim 27, wherein the second scan direction is selected so that the total length of the image feature boundaries resolved orthogonally to the second scan direction, which are exposed to the patterned beam at any instant in time, is minimized.

29. The method of claim 17, wherein:
the first and second scan directions are selected relative to the first and second image portions, respectively, taking into account image feature boundaries across the array of individually controllable elements that change state as the respective portion of the image is scanned;
the first scan direction is selected so that the total length of the image feature boundaries resolved in a direction parallel to the first scan direction is equal to or greater than the total image feature boundary length of the first image portion resolved orthogonally to the first scan direction; and
the second scan direction is selected so that the total length of the image feature boundaries resolved parallel to the second scan direction is equal to or greater than the total image boundary length of the second image portion resolved orthogonally to the second scan direction.

30. The method of claim 17, wherein:
the first and second scan directions are selected relative to the first and second image portions, respectively, taking into account image feature boundaries across the array of individually controllable elements that change state as the respective portion of the image is scanned;
the first scan direction is selected so that the total length of the image feature boundaries resolved in a direction orthogonal to the first scanned direction is minimized; and
the second scan direction is selected so that the total length of the image feature boundaries resolved orthogonally to the second scan direction is minimized.

31. The method of claim 17, further comprising:
dividing the image to be projected; and
selecting respective scan directions to minimize the total number of changes of state of elements of the array of individually controllable elements as the entire target portion is scanned with the complete image.

32. The method of claim 17, further comprising:
dividing the image to be projected; and
selecting respective scan directions so that the maximum number of elements of the array of individually controlled elements that change state as any single image frame is loaded is below a predetermined maximum.

33. The method of claim 17, further comprising:
dividing the image to be projected; and
selecting respective scan directions to minimize the number of times any particular element of the array of individually controlled elements that change state as the target portion is scanned.

34. The method of claim 2, wherein the scan operation is performed to minimize the total number of changes of state of elements of the array of individually controlled elements as the entire target portion is scanned.

35. The method of claim 2, wherein the scan direction is selected to ensure that the number of individually controllable elements of the array that change state as any single image frame is loaded is below a predetermined maximum.

36. The method of claim 2, wherein the scan operation is performed to minimize the number of times any particular element of the array of individually controllable elements that change state as the target portion is scanned.

37. The method of claim 1, wherein the patterned beam of radiation is projected on to the entire target portion in a single exposure and each new image frame is loaded on to the array of individually controllable elements between exposures.

38. The method of claim 1, wherein:
   at least one of the array of individually controllable elements and the beam is moved to produce relative movement therebetween in a first direction, such that the beam is caused to scan over the array; and
   the substrate is moved in a direction parallel to the first direction so that the patterned beam is scanned across the target portion.

39. A lithographic apparatus, comprising:
   an illumination system that supplies a beam of radiation;
   an array of individually controllable elements that pattern the beam;
   a projection system that projects the patterned beam onto a target portion of a substrate; and
   means for periodically addressing elements of the array of individually controllable elements in an image frame loading operation to set a state of each individually controllable element appropriate to the pattern to be projected,
   wherein only those individually controllable elements that change state are addressed when a given frame is loaded.

40. The apparatus of claim 39, wherein the means for addressing the array of individually controllable elements comprises a data path and drive electronics for addressing each element of the array in a matrix addressing operation.

41. The apparatus of claim 40, further comprising:
   means for moving at least one of the substrate and the patterned beam of radiation to produce relative movement therebetween in at least a first scan direction.

42. The apparatus of claim 41, wherein:
   the illumination system provides a beam comprising pulses of radiation; and
   the means for addressing the array of individually controllable elements is operated to load each new image frame between radiation pulses.

43. The apparatus of claim 41, wherein:
   the illumination system produces a beam that is continuous during a scanning operation; and
   the means for addressing the array of individually controllable elements operates to load each new image frame as the patterned beam scans across the target portion of the substrate.

44. The apparatus of claim 41, further comprising:
   a microlens array that projects the patterned beam of radiation onto the substrate as an array of radiation spots.

45. The apparatus of claim 41, further comprising:
   means for analyzing the image to be projected and determining a scan direction that minimizes the number of individually controllable elements of the array that change state as any single image frame is loaded during scanning of the target portion.

46. The apparatus of claim 45, wherein the means for analyzing determines the scan direction taking into account image feature boundaries across the array of individually controllable elements that change state as the target portion is scanned.

47. The apparatus of claim 46, wherein the means for analyzing analyzes the image and selects a scan direction so that for (a) the total length of the image feature boundaries resolved parallel to the scan direction, which are exposed to the patterned beam of radiation at any instant in time, is equal to or greater than (b) the total image boundary length resolved orthogonally to the scan direction, which are exposed to the patterned beam of radiation at any instant in time.

48. The apparatus of claim 46, wherein the means for analyzing analyzes the image to determine a scan direction for that the total length of the image feature boundaries resolved orthogonally to the scan direction, which are exposed to the patterned beam of radiation at any instant in time, is minimized.

49. The apparatus of claim 41, wherein:
   the means for producing relative movement between the substrate and patterned beam of radiation provides relative movement in a plurality of directions including at least a first scan direction and a second scan direction; and
   a first image portion of the image to be projected onto the target portion is scanned in a respective first scan direction; and
   a second image portion of the image to be projected onto the target portion is scanned in a respective second scan direction.

50. The apparatus of claim 49, wherein the first scan direction is orthogonal to the second scan direction.

51. A device manufacturing method, comprising:
   patterning a beam of radiation using a pattern device comprising an array of individually controllable elements;
   projecting the patterned beam of radiation onto a target portion of a substrate;
   providing image data to the pattern device to periodically update the pattern to be projected;
   periodically addressing individual elements of the array of individually controllable elements in an image frame loading operation to set a state of each individually controllable element appropriate to the pattern to be projected in accordance with the image data,
   wherein the image data provided to the pattern device comprises data pertaining only to those individually controllable elements that change state from one image frame to the next.

52. The device manufacturing method of claim 51, wherein only those individually controllable elements that change state are addressed each time an image frame is loaded.

53. The device manufacturing method of claim 51, wherein:
   the pattern device includes a buffer;
   the image data is provided to the buffer;
   the image data is stored in the buffer; and
   the image data is used to periodically update the array of individually controllable elements,
   wherein each individually controllable element of the array is addressed each time an image frame is loaded.

54. The device manufacturing method of claim 53, wherein image data provided to the buffer pertaining to one image frame is added to data previously provided to the buffer pertaining to the preceding image frame, the cumulative data then being used to update the array of individually controllable elements.

55. The device manufacturing method of claim 54, wherein the cumulative data is provided to a driver of the array for addressing each of the individually controllable elements of the array in accordance with the cumulative data.

56. The apparatus of claim 54, further comprising:
a driver that addresses the array of individually controllable elements, the cumulative data being provided to the driver of the array from the buffer.

57. A lithographic apparatus, comprising:
an illumination system that supplies a beam of radiation;
a pattern device comprising an array of individually controllable elements that patterns the beam;
a projection system that projects the patterned beam onto a target portion of a substrate; and
means for providing image data to the pattern device for periodic updating of the pattern to be projected,
wherein the array of individually controllable elements include means for periodically addressing elements of the array in an image frame loading operation to set a state of each individually controllable element appropriate to the pattern to be projected, and
wherein the means for providing image data provides data pertaining only to elements of the array that change state from one image frame to the next.

58. The apparatus of claim 57, wherein the means for periodically addressing elements of the array addresses only elements of the array that change state each time an image frame is loaded.

59. The apparatus of claim 57, wherein the means for periodically addressing elements of the array addresses each element of the array each time an image frame is loaded.

60. The apparatus of claim 59, wherein the pattern device further comprises a buffer for receiving the image data.

61. The apparatus of claim 60, wherein image data provided to the buffer pertaining to one image frame is added to data previously provided to the buffer pertaining to a preceding image frame and added within the buffer to provide cumulative image data that is then used to update the array of individually controllable elements.

62. A device manufacturing method, comprising:
patterning a beam of radiation using an array of individually controllable elements; and
projecting the patterned beam of radiation onto a target portion of a substrate;
providing image data to the array from a digital image storage device for periodic updating of the pattern to be projected; and
periodically addressing individual elements of the array of individually controllable elements in an image frame loading operation to set a state of each individually controllable element appropriate to the pattern to be projected in accordance with the image data,
wherein the image data relates only to elements of the array that change state from one image frame to the next.

63. A lithographic apparatus, comprising:
an illumination system that supplies a beam of radiation;
an array of individually controllable elements that pattern the beam;
a projection system that projects the patterned beam onto a target portion of a substrate; and
a data path that provides image data to array from a digital image storage device for periodic updating of the pattern to be projected,
wherein the array of individually controllable elements include means for periodically addressing elements of the array in an image frame loading operation to set a state of each individually controllable element appropriate to the pattern to be projected, and
wherein the image data comprises data relating only to those elements of the array that change state from one image frame to the next.

* * * * *